United States Patent [19]
Palmer

[11] 4,188,587
[45] Feb. 12, 1980

[54] LINEAR GAIN CONTROL APPARATUS UTILIZING FEED FORWARD LEVEL CONTROL

[75] Inventor: James R. Palmer, Mesa, Ariz.

[73] Assignee: Motorola, Inc., Schaumburg, Ill.

[21] Appl. No.: 918,857

[22] Filed: Jun. 26, 1978

[51] Int. Cl.² ............................................. H03G 3/20
[52] U.S. Cl. ..................................... 330/136; 330/279
[58] Field of Search ................ 328/145; 330/127, 129, 330/136, 279

[56] References Cited
U.S. PATENT DOCUMENTS

| | | | |
|---|---|---|---|
| 3,475,688 | 10/1969 | Masonson | 330/136 X |
| 3,652,871 | 3/1972 | Delagrange | 328/145 X |

*Primary Examiner*—James B. Mullins
*Attorney, Agent, or Firm*—Eugene A. Parsons

[57] ABSTRACT

A gain control amplifier including a plurality of cascaded multipliers with a feed forward gain control circuit attached between the input and a control terminal of the amplifier and providing a logarithmic function of a logarithmic function as the control signal for converting the transfer function of the amplifier to a substantially linear function.

6 Claims, 1 Drawing Figure

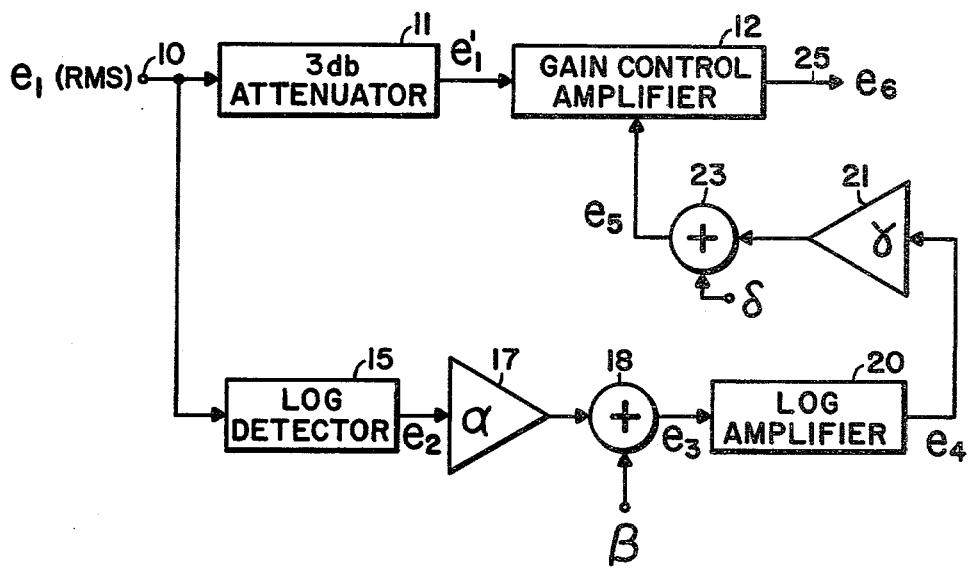

LINEAR GAIN CONTROL APPARATUS UTILIZING FEED FORWARD LEVEL CONTROL

BACKGROUND OF THE INVENTION

In many applications, it is desirable to provide an amplifier having a linear function, especially in level control systems and the like. Further, in many specialized applications it is essential that the system have a fast response time and, consequently, the amplifier circuitry, as well as any control circuitry associated therewith, must have a fast response time. The conventional solution to the linearization of a function of the type displayed by amplifier circuitry incorporating a plurality of cascaded multipliers, is to use an exponential gain device in a feedforward control circuit. However, such circuitry is extremely complex, relatively slow and tends to be unstable and difficult to compensate for temperature variations.

SUMMARY OF THE INVENTION

The present invention pertains to substantially linear gain control apparatus incorporating a gain control amplifier, including a plurality of cascaded multipliers, and means for feeding a control signal forward from the input of the amplifier to a control terminal thereof, said means providing a logarithmic function of a logarithmic function of the input signal. The control signal may be produced, for example, by means of a logarithmic detector connected to receive the input signal to the amplifier and a logarithmic amplifier connected to receive the output signal from the logarithmic detector and to supply a control signal to the control terminal of the gain control amplifier.

It is an object of the present invention to provide new and improved substantially linear gain control apparatus.

It is a further object of the present invention to provide new and improved substantially linear gain control apparatus incorporating a feed forward logarithmic function of a logarithmic function control signal for linearizing a gain control amplifier circuit.

These and other objects of this invention will become apparent to those skilled in the art upon consideration of the accompanying specification, claims and drawing.

BRIEF DESCRIPTION OF THE DRAWING

The single FIGURE is a block diagram of linear gain control apparatus embodying the present invention.

DESCRIPTION OF THE PREFERRED EMBODIMENT

Referring to the drawing, the number 10 indicates an input terminal adapted to receive an input signal having an RMS voltage $e_1$. The input terminal 10 is connected through a 3 dB attenuator 11 to the input of a gain control amplifier 12. The input terminal 10 is also connected to the input of a logarithmic detector 15. The output of the logarithmic detector 15 is applied through an amplifier 17 to one input of a summing device 18. A second input of the summing device 18 is adapted to receive a compensating signal, $\beta$, thereon. The output of the summing device 18 is connected to the input of a logarithmic amplifier 20. The output of the logarithmic amplifier 20 is connected through an amplifier 21 to one input of a second summing device 23. A second input of the summing device 23 is adapted to receive a second compensating signal $\delta$. The output of the summing device 23 is connected to a control terminal of the gain control amplifier 12 for adjusting the gain of the amplifier 12 in accordance with the signal applied thereto. The output of the gain control amplifier 12 is available at an output terminal 25.

In this embodiment and for purposes of explanation, the input signal at the terminal 10 is designated $e_1$, which is the RMS voltage. The signal at the input of the gain control amplifier 12 is designated $e_1'$, the signal at the output of the logarithmic detector 15 is designated $e_2$, the signal at the input of the logarithmic amplifier 20 is designated $e_3$ with the signal at the output thereof being designated $e_4$, the signal at the control terminal of the gain control amplifier 12 is designated $e_5$ and the signal at the output terminal 25 is designated $e_6$. Also, in this embodiment, the amplifier 17 has an amplification factor $\alpha$ and the amplifier 21 has an amplification factor $\gamma$. The 3 dB attenuator 11 is utilized in this embodiment to adjust the amplitude of the signal passing through the gain control amplifier 12 and, in many instances, an attenuator may not be required or a different amount of attenuation may be desirable. Also, the amplification factors $\alpha$ and $\gamma$ and the added compensating signals $\beta$ and $\delta$ are provided in this embodiment to more closely fit the curve of the control signal to the natural transfer function of the gain control amplifier 12 for linearization purposes. The gain control amplifier 12 consists of five wide band amplifier IC circuits, which may be for example circuits sold under the part number UTO513 by Avantek, and four multiplier IC circuits, which in this embodiment are constructed under the part number MIC-336 by Motorola, Inc. A first wide band amplifier is connected as the input stage and the output is connected to the input of a first multiplier, the output of which is transformer coupled to the input of a second wide band amplifier stage, the output of which is connected to the input of a second multiplier, etc. It has been found that three multipliers or less cascaded in this fashion tend to produce a greater error in the linearization, while four multipliers or more tend to increase the linearization utilizing the described control circuit. While the additional amplification factors $\alpha$ and $\gamma$ and the additional compensation factors $\beta$ and $\delta$ are required for the specific gain control amplifier 12 utilized in this embodiment, other gain control amplifier embodiments may be devised by those skilled in the art which require additional, different, or fewer modifying factors to produce the required linearization and the specific embodiment illustrated is simply an exemplary embodiment. The logarithmic detector 15 may be any commercially available detector and the logarithmic amplifier 20 may be any of a large variety of logarithmic amplifiers which will provide the desired function.

To determine the values of the various compensating signals and to illustrate the operation of the circuit, the following analasys is used. The output signal of the logarithmic detector 15 is $$e_2 = (K_1 \log_{10} e_1 + C_1)$$

The output signal from the amplifier 17 is $$e_2' = \alpha e_2 = \alpha K_1 \log_{10} e_1 + \alpha C_1$$

and the output signal from the summing device 18 is $$e_3 = e_2' + \beta = \alpha e_2 + \beta$$

The output signal from the logarithmic amplifier 20 is $$e_4 = (K_2 \log_{10} e_3 + C_2)$$

and the output signal from the summing device 23 is $$\begin{aligned}
e_5 &= \gamma e_4 + \delta \\
&= \gamma K_2 \log_{10} e_3 + \gamma C_2 + \delta \\
&= \gamma K_2 \log_{10} (e_2' + \beta) + \gamma C_2 + \delta \\
&= \gamma K_2 \log_{10} (\alpha e_2 + \beta) + \gamma C_2 + \delta \\
&= \gamma K_2 \log_{10} [\alpha(K_1 \log_{10} e_1 + C_1) + \beta] + \gamma C_2 + \delta
\end{aligned}$$

Let $\epsilon = 1/\ln 10$
Therefore $\epsilon \ln N = \log_{10} N$
Therefore,
$$\begin{aligned}
e_5 &= \gamma K_2 \epsilon \ln [\alpha(K_1 \epsilon \ln e_1 + C_1) + \beta] + \gamma C_2 + \delta \\
&= \gamma K_2 \epsilon \ln [\alpha K_1 \epsilon \ln e_1 + \alpha C_1 + \beta] + \gamma C_2 + \delta \\
&= \gamma K_2 \epsilon \ln \left[ \ln e_1 + \frac{\alpha C_1 + \beta}{\alpha K_1 \epsilon} \right] + \gamma K_2 \epsilon \ln (\alpha K_1 \epsilon) + \gamma C_2 + \delta
\end{aligned}$$

Now let $b = \gamma K_2 \epsilon$
$$c = \frac{\alpha C_1 + \beta}{\alpha K_1 \epsilon}$$
$$a = \gamma K_2 \epsilon \ln (\alpha K_1 \epsilon) + \gamma C_2 + \delta$$

Thus, $\gamma = \frac{b}{K_2 \epsilon}$ and $\alpha C_1 + \beta = C \alpha K_1 \epsilon$ Therefore, $C_1 + \frac{\beta}{\alpha} = C K_1 \epsilon$ or $\frac{\beta}{\alpha} = C K_1 \epsilon - C_1$ Let $\alpha = 1$
Therefore $\beta = C K_1 \epsilon - C_1$ Then $a = \left( \frac{b}{K_2 \epsilon} \right) K_2 \epsilon \ln (K_1 \epsilon) + \frac{b}{K_2 \epsilon} C_2 + \delta$ $= b \ln (K_1 \epsilon) + \frac{b C_2}{K_2 \epsilon} + \delta$ or $\delta = a - \frac{b C_2}{K_2 \epsilon} - b \ln (K_1 \epsilon)$ Then $e_5 = a + b \ln (\ln e_1 + C)$ The transfer function of the gain control amplifier 12 can be expressed by the equation $$e_6 = e_1' (K e_5)^N$$
When $e_5 = -1.773$
$e_1' = e_6$
Therefore,
$1 = [-1.773 K]^N$
$K = \frac{1}{-1.773}$ Therefore, $e_6 = e_1' \left( \frac{e_5}{-1.773} \right)^N$ When $e_5 = -6.908$
$e_6/e_1' = 316.228$ Therefore, $316.228 = \left( \frac{-6.908}{-1.773} \right)^N$
$= (3.89622)^N$ and $N \log_{10}(3.89622) = 2.5$
Therefore, $N = 4.23267$ The transfer function for the gain control amplifier thus becomes $$e_6 = e_1' \left( \frac{e_5}{-1.773} \right)^{4.23267}$$

Therefore, $e_5 = 1.773 \left( \frac{e_6}{e_1'} \right)^{0.236258}$ and $e_6$ is such as to maintain the output at $-23$ dBM in 50 ohms. Therefore, $e_6$ equals 0.0158302 volts (RMS). Let the corresponding value of $e_5$ be $e_{50}$. Therefore, $$e_{50} = -1.773 \left( \frac{.0158302}{e_1'} \right)^{0.236258}$$

The circuit incorporating the invention provides $$e_5 = a + b \ln (\ln e_1 + C)$$

whereas $e_{50} = -1.773 \left[ \frac{.0158302}{e_1'} \right]^{0.236258}$

By setting $e_5$ equal to $e_{50}$ at three different values of input power ($P_1$), eg. $-10$ dBm, $-40$ dBm and $-70$ dBm, the value of a, b and c can be calculated. These values of $P_1$ correspond to input power, $P_1'$, into the gain control amplifier 12 equal to $-13$ dBm, $-43$ dBm and $-73$ dBm, since $e_1'$ is 3 dB down from $e_1$.

$$e_1' = \sqrt{.05 \log_{10}^{-1} \frac{P_1'}{10}} \text{ volts (RMS)}$$

Therefore,
when $P_1' = -13$ dBm, $e_1' = 5.006 \times 10^{-2}$ volts (RMS)
$P_1' = -43$ dBm, $e_1' = 1.583 \times 10^{-3}$ volts (RMS)
$P_1' = -73$ dBm, $e_1' = 5.006 \times 10^{-5}$ volts (RMS)
and when $P_1' = -13$ dBm, $e_{50} = -1.351$ volts
$P_1' = -43$ dBm, $e_{50} = -3.054$ volts
$P_1' = -73$ dBm, $e_{50} = -6.908$ volts Since $e_5 = a + b \ln (\ln e_1 + C)$ to match, or set $e_5$ equal to $e_{50}$, at the three points the following equations apply $-1.351 = a + b \ln [\ln (7.071 \times 10^{-2}) + C]$
$-3.054 = a + b \ln [\ln (2.236 \times 10^{-3}) + C]$
$-6.908 = a + b \ln [\ln (7.071 \times 10^{-5}) + C]$
Therefore,
$-1.351 = a + b \ln [C - 2.649]$
$-3.054 = a + b \ln [C - 6.103]$
$-6.908 = a + b \ln [C - 9.557]$
$a = 1.351 - b \ln [C - 2.649]$
Therefore $-3.054 = -1.351 - b \ln [C - 2.649] + b \ln [C - 6.103]$ and $-1.703 = b \ln \left[ \frac{C - 6.103}{C - 2.649} \right]$ Therefore, $b = \left\{ \dfrac{-1.703}{\ln \left[ \dfrac{C - 6.103}{C - 2.649} \right]} \right\}$ By substitution $-6.908 = -1.351 + \left\{ \dfrac{1.703}{\ln \left[ \dfrac{C - 6.103}{C - 2.649} \right]} \right\} [\ln (C - 2.649)] - \dfrac{1.703}{\ln \left[ \dfrac{C - 6.103}{C - 2.649} \right]} [\ln (C - 9.557)]$ Solving the above equation for C results in the answer C=11.0485, and substituting this answer back into the previous equations gives the solutions, b=3.215 and a=−8.193. Therefore, $$e_5 = -8.193 + 3.215 \ln (\ln e_1 + 11.0485)$$

Thus, it can be seen that the control signal, $e_5$, is a logarithmic function of a logarithmic function of the signal, $e_1$, applied to the input of the circuit. The following table is a list of values for the various terms defined above. In this table, as shown by the above equations, $e_5$ is the value of control signal required for a perfect match at the output while $e_{50}$ is the approximate value obtained. The amount of error between the two is listed, with the three matched points being zero.

Thus a feed forward level control is disclosed wherein the input signal is utilized to develop a control signal and the control signal is used to control the gain of a gain control amplifier. The control signal is operated upon to substantially linearize the gain control amplifier and, because a logarithmic function of a logarithmic function is developed, the system has an improved temperature stability, a faster response time and is less complicated and less expensive to produce.

| (dBm) $P_I$ | (dBm) $P_1$ | $e_1$ | $e_1{'}$ | $e_5$ | $e_{50}$ | G(dB) f($e_5$) | G(dB) f($e_{50}$) | dB error |
|---|---|---|---|---|---|---|---|---|
| −10 | −13 | $7.071 \times 10^{-2}$ | $5.006 \times 10^{-2}$ | −1.351 | −1.351 | −10.000 | −10.000 | 0 |
| −11 | −14 | $6.302 \times 10^{-2}$ | $4.462 \times 10^{-2}$ | −1.395 | −1.388 | −8.815 | −9.000 | +0.185 |
| −14 | −17 | $4.462 \times 10^{-2}$ | $3.159 \times 10^{-2}$ | −1.532 | −1.506 | −5.371 | −6.000 | +0.629 |
| −17 | −20 | $3.159 \times 10^{-2}$ | $2.236 \times 10^{-2}$ | −1.675 | −1.634 | −2.090 | −3.000 | +0.910 |
| −20 | −23 | $2.236 \times 10^{-2}$ | $1.583 \times 10^{-2}$ | −1.825 | −1.773 | +1.062 | 0.000 | +1.062 |
| −23 | −26 | $1.583 \times 10^{-2}$ | $1.121 \times 10^{-2}$ | −1.982 | −1.924 | +4.097 | +3.000 | +1.097 |
| −26 | −29 | $1.121 \times 10^{-2}$ | $7.934 \times 10^{-3}$ | −2.147 | −2.087 | +7.037 | +6.000 | +1.037 |
| −29 | −32 | $7.934 \times 10^{-3}$ | $5.617 \times 10^{-3}$ | −2.321 | −2.265 | +9.902 | +9.000 | +0.902 |
| −32 | −35 | $5.617 \times 10^{-3}$ | $3.976 \times 10^{-3}$ | −2.505 | −2.457 | +12.706 | +12.000 | +0.706 |
| −35 | −38 | $3.976 \times 10^{-3}$ | $2.815 \times 10^{-3}$ | −2.700 | −2.666 | +15.462 | +15.000 | +0.462 |
| −38 | −41 | $2.815 \times 10^{-3}$ | $1.993 \times 10^{-3}$ | −2.908 | −2.891 | +18.191 | +18.000 | +0.191 |
| −40 | −43 | $2.236 \times 10^{-3}$ | $1.583 \times 10^{-3}$ | −3.054 | −3.054 | +20.000 | +20.000 | 0 |
| −41 | −44 | $1.993 \times 10^{-3}$ | $1.411 \times 10^{-3}$ | −3.130 | −3.139 | +20.895 | +21.000 | −0.109 |
| −44 | −47 | $1.411 \times 10^{-3}$ | $9.988 \times 10^{-4}$ | −3.368 | −3.406 | +23.590 | +24.000 | −0.410 |
| −47 | −50 | $9.988 \times 10^{-4}$ | $7.071 \times 10^{-4}$ | −3.626 | −3.695 | +26.303 | +27.000 | −0.697 |
| −50 | −53 | $7.071 \times 10^{-4}$ | $5.006 \times 10^{-4}$ | −3.906 | −4.010 | +29.038 | +30.000 | −0.962 |
| −53 | −56 | $5.006 \times 10^{-4}$ | $3.544 \times 10^{-4}$ | −4.213 | −4.350 | +31.820 | +33.000 | −1.180 |
| −56 | −59 | $3.544 \times 10^{-4}$ | $2.509 \times 10^{-4}$ | −4.552 | −4.720 | +34.665 | +36.000 | −1.335 |
| −59 | −62 | $2.509 \times 10^{-4}$ | $1.776 \times 10^{-4}$ | −4.931 | −5.122 | +37.605 | +39.000 | −1.395 |
| −62 | −65 | $1.776 \times 10^{-4}$ | $1.257 \times 10^{-4}$ | −5.362 | −5.558 | +40.686 | +42.000 | −1.314 |
| −65 | −68 | $1.257 \times 10^{-4}$ | $8.902 \times 10^{-5}$ | −5.859 | −6.030 | +43.945 | +45.000 | −1.055 |
| −68 | −71 | $8.902 \times 10^{-5}$ | $6.302 \times 10^{-5}$ | −6.446 | −6.542 | +47.455 | +48.000 | −0.545 |
| −70 | −73 | $7.071 \times 10^{-5}$ | $5.006 \times 10^{-5}$ | −6.908 | −6.908 | +50.000 | +50.000 | 0 |

While I have shown and described a specific embodiment of this invention, further modifications and improvements will occur to those skilled in the art. I desire it to be understood, therefore, that this invention is not limited to the particular form shown and I intend in the appended claims to cover all modifications which do not depart from the spirit and scope of this invention.

What I claim is:

1. Substantially linear gain control apparatus comprising:
   (a) gain control amplifier circuitry including cascaded multipliers configured as gain control elements having an input, an output and a control terminal providing a predetermined transfer function therethrough;
   (b) logarithmic detector means having an input connected to the input of said gain control amplifier circuitry and an output, said detector means providing a signal at the output thereof which is a logarithmic function of any signals supplied to the input;
   (c) logarithmic amplifier means having an input coupled to the output of said detector means and an output coupled to the control terminal of said gain control amplifier circuitry, said logarithmic amplifier means providing an output signal which is a logarithmic function of the logarithmic function of the signal applied to the input thereof; and
   (d) means coupled to said logarithmic amplifier means for adjusting the signal applied to the control terminal of said gain control amplifier circuitry to alter the predetermined transfer function to a substantially linear function.

2. Substantially linear gain control apparatus as claimed in claim 1 wherein the gain control amplifier circuitry includes more than three cascaded multipliers.

3. Substantially linear gain control apparatus as claimed in claim 1 wherein means for receiving and combining a compensation signal component is coupled between the logarithmic detector means and the logarithmic amplifier means.

4. Substantially linear gain control apparatus as claimed in claim 1 wherein means for receiving and combining a compensation signal component is coupled between the logarithmic amplifier means and the control terminal of the gain control amplifier circuitry.

5. A method of providing a substantially linear gain of a selected signal comprising the steps of amplifying the selected signal through a plurality of cascaded multipliers configured as gain control elements for controlling the gain, providing a control signal which is a logarithmic function of a logarithmic function of the selected signal, and utilizing the control signal to control the gain of the cascaded multipliers.

6. A method as claimed in claim 5 including in addition the step of combining additional compensating signals with the logarithmic function of the logarithmic function of the selected signal.

* * * * *